(12) United States Patent
Lim et al.

(10) Patent No.: US 8,015,469 B2
(45) Date of Patent: Sep. 6, 2011

(54) METHOD FOR GENERATING NON-BINARY STRUCTURED LOW DENSITY PARITY CHECK CODE

(75) Inventors: Chi-Woo Lim, Suwon-si (KR);
Sung-Eun Park, Seoul (KR);
Dong-Seek Park, Yongin-si (KR);
Jae-Yoel Kim, Suwon-si (KR);
Seung-Hoon Choi, Suwon-si (KR);
Gyu-Bum Kyung, Suwon-si (KR);
Hong-Sil Jeong, Seoul (KR); Thierry Lestable, Staines (GB)

(73) Assignee: Samsung Electronics Co., Ltd (KR)

( * ) Notice: Subject to any disclaimer, the term of this patent is extended or adjusted under 35 U.S.C. 154(b) by 1160 days.

(21) Appl. No.: 11/800,022

(22) Filed: May 3, 2007

(65) Prior Publication Data

US 2008/0250305 A1    Oct. 9, 2008

(30) Foreign Application Priority Data

May 3, 2006   (KR) .................. 10-2006-0040135

(51) Int. Cl.
*H03M 13/00* (2006.01)
(52) U.S. Cl. .................. 714/752; 714/758; 714/784
(58) Field of Classification Search .................. 714/752, 714/801, 779, 784, 758
See application file for complete search history.

(56) References Cited

U.S. PATENT DOCUMENTS

| 7,181,677 B1* | 2/2007 | Weng ........................... 714/784 |
| 2006/0036925 A1 | 2/2006 | Kyung et al. |
| 2009/0259915 A1* | 10/2009 | Livshitz et al. ............... 714/758 |

FOREIGN PATENT DOCUMENTS

KR    2006-16059    2/2006

OTHER PUBLICATIONS

Ivan Djordjevic et al., "Nonbinary LDPC Codes for Optical Communication Systems", IEEE Photonics Technology Letters, vol. 17, No. 10, Oct. 2005.

* cited by examiner

*Primary Examiner* — Fritz Alphonse
(74) *Attorney, Agent, or Firm* — The Farrell Law Firm, P.C.

(57) ABSTRACT

A method for generating a non-binary Low Density Parity Check (LDPC) code. The method includes generating non-binary identity matrixes so as to satisfy at least one condition, wherein the non-binary LDPC code is defined by a parity check matrix, and the parity check matrix includes a plurality of sub-matrixes, which are divided into zero matrixes and the non-binary identity matrixes.

4 Claims, 4 Drawing Sheets

$$P^1 = \begin{bmatrix} 0 & 1 & 0 & 0 & \cdots & 0 \\ 0 & 0 & 1 & 0 & \cdots & 0 \\ 0 & 0 & 0 & 1 & \cdots & 0 \\ \vdots & \vdots & \vdots & \vdots & \ddots & \vdots \\ 0 & 0 & 0 & 0 & \cdots & 1 \\ 1 & 0 & 0 & 0 & \cdots & 0 \end{bmatrix}$$

$$P^i = \begin{bmatrix} 0 & 0 & \cdots & 1 & 0 & 0 \\ 0 & 0 & 0 & \cdots & 1 & 0 \\ 0 & 0 & 0 & 0 & \cdots & 1 \\ 1 & 0 & 0 & 0 & \cdots & 0 \\ \vdots & \vdots & \vdots & \vdots & \ddots & \vdots \\ 0 & 0 & 1 & 0 & \cdots & 0 \end{bmatrix}$$

$$P^1 = \begin{bmatrix} 0 & 1 & 0 & 0 & \cdots & 0 \\ 0 & 0 & 1 & 0 & \cdots & 0 \\ 0 & 0 & 0 & 1 & \cdots & 0 \\ \vdots & \vdots & \vdots & \vdots & \ddots & \vdots \\ 0 & 0 & 0 & 0 & \cdots & 1 \\ 1 & 0 & 0 & 0 & \cdots & 0 \end{bmatrix}$$

$$P^i = \begin{bmatrix} 0 & 0 & \cdots & 1 & 0 & 0 \\ 0 & 0 & 0 & \cdots & 1 & 0 \\ 0 & 0 & 0 & 0 & \cdots & 1 \\ 1 & 0 & 0 & 0 & \cdots & 0 \\ \vdots & \vdots & \vdots & \vdots & \ddots & \vdots \\ 0 & 0 & 1 & 0 & \cdots & 0 \end{bmatrix}$$

$\xrightarrow{\quad i \quad}$

FIG.1

Type 1

| $\alpha^{F(i)}P^i$ | 0 | 0 | 0 | 0 | $\cdots$ | 0 |
|---|---|---|---|---|---|---|
| 0 | 0 | $\alpha^{F(i)}P^i$ | 0 | 0 | $\cdots$ | $\alpha^{F(i)}P^i$ |
| 0 | 0 | 0 | 0 | $\alpha^{F(i)}P^i$ | $\cdots$ | 0 |
| 0 | $\alpha^{F(i)}P^i$ | 0 | 0 | 0 | $\cdots$ | 0 |
| 0 | 0 | 0 | $\alpha^{F(i)}P^i$ | 0 | $\cdots$ | 0 |
| $\vdots$ | $\vdots$ | $\vdots$ | $\vdots$ | $\vdots$ | $\ddots$ | $\alpha^{F(i)}P^i$ |
| 0 | 0 | $\alpha^{F(i)}P^i$ | 0 | $\alpha^{F(i)}P^i$ | $\cdots$ | 0 |

Type 2

| $\alpha^j \cdot P^i$ | 0 | 0 | 0 | 0 | $\cdots$ | 0 |
|---|---|---|---|---|---|---|
| 0 | 0 | $\alpha^j \cdot P^i$ | 0 | 0 | $\cdots$ | $\alpha^j \cdot P^i$ |
| 0 | 0 | 0 | 0 | $\alpha^j \cdot P^i$ | $\cdots$ | 0 |
| 0 | $\alpha^j \cdot P^i$ | 0 | 0 | 0 | $\cdots$ | 0 |
| 0 | 0 | 0 | $\alpha^j \cdot P^i$ | 0 | $\cdots$ | 0 |
| $\vdots$ | $\vdots$ | $\vdots$ | $\vdots$ | $\vdots$ | $\ddots$ | $\alpha^j \cdot P^i$ |
| 0 | 0 | $\alpha^j \cdot P^i$ | 0 | $\alpha^j \cdot P^i$ | $\cdots$ | 0 |

Type 3

| $S \cdot P^i$ | 0 | 0 | 0 | 0 | $\cdots$ | 0 |
|---|---|---|---|---|---|---|
| 0 | 0 | $S \cdot P^i$ | 0 | 0 | $\cdots$ | $S \cdot P^i$ |
| 0 | 0 | 0 | 0 | $S \cdot P^i$ | $\cdots$ | 0 |
| 0 | $S \cdot P^i$ | 0 | 0 | 0 | $\cdots$ | 0 |
| 0 | 0 | 0 | $S \cdot P^i$ | 0 | $\cdots$ | 0 |
| $\vdots$ | $\vdots$ | $\vdots$ | $\vdots$ | $\vdots$ | $\ddots$ | $S \cdot P^i$ |
| 0 | 0 | $S \cdot P^i$ | 0 | $S \cdot P^i$ | $\cdots$ | 0 |

FIG.2

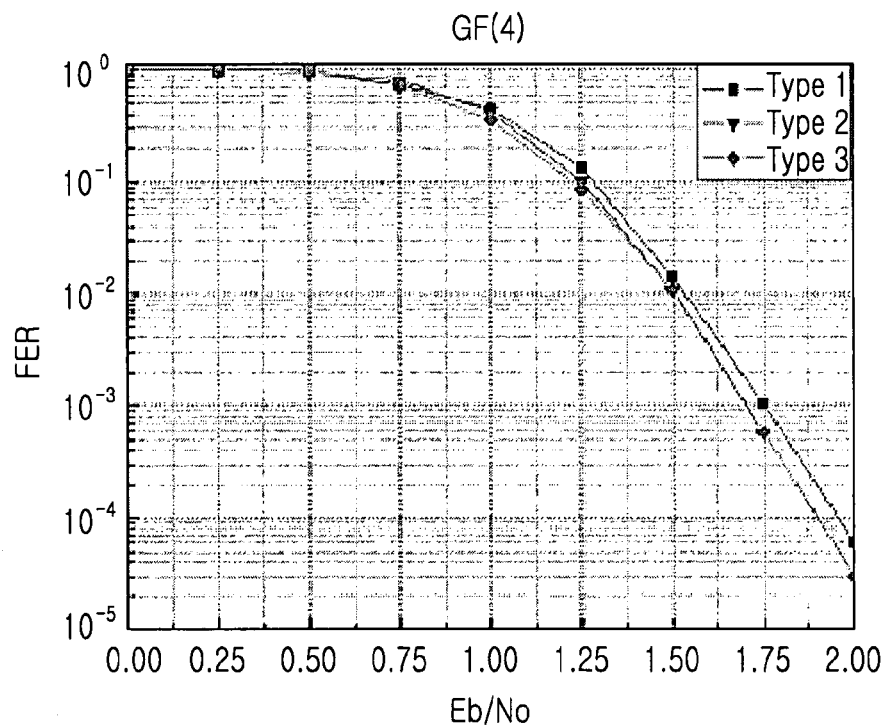
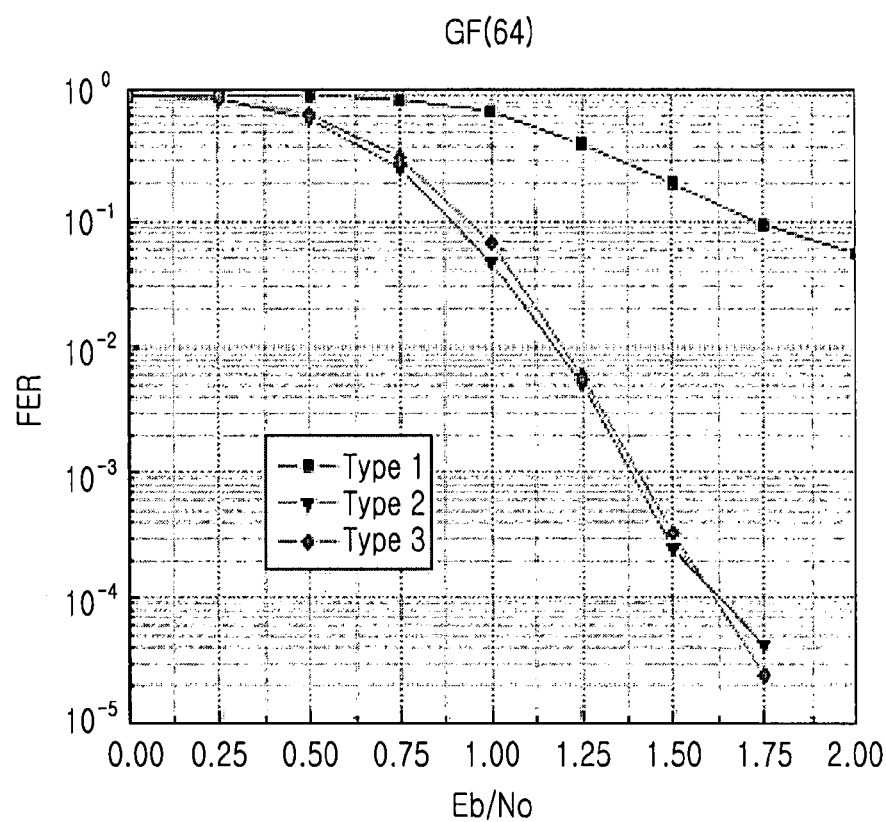
FIG.3A

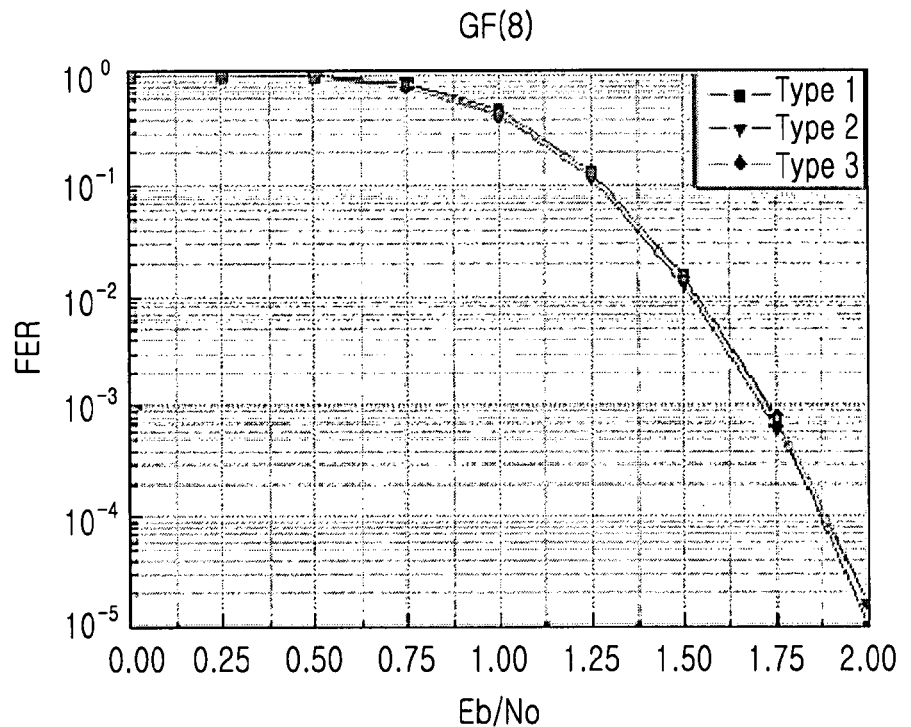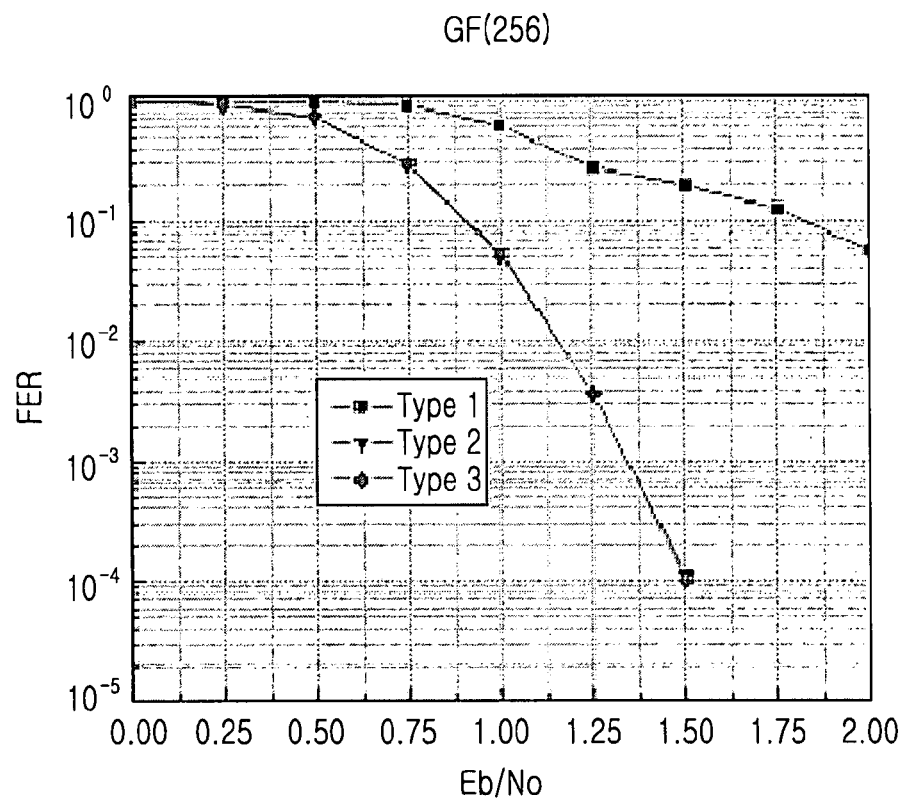
FIG.3B

METHOD FOR GENERATING NON-BINARY STRUCTURED LOW DENSITY PARITY CHECK CODE

PRIORITY

This application claims priority under 35 U.S.C. §119(a) to a Korean Patent Application filed in the Korean Intellectual Property Office on May 3, 2006 and assigned Serial No. 2006-40135, the disclosure of which is incorporated herein by reference.

BACKGROUND OF THE INVENTION

1. Field of the Invention

The present invention relates generally to a non-binary structured Low Density Parity Check (LDPC) code, and in particular, to a method for generating a non-binary structured LDPC code.

2. Description of the Related Art

The key issue in communication is to transmit data efficiently and reliably over a channel. The next generation multimedia mobile communication system, now being developed, requires a high-speed communication system that can process and transmit a variety of information such as image and radio data beyond the early voice-oriented service. Therefore, it is necessary to increase the system efficiency with the use of a channel coding technique suitable for the system.

During data transmission, inevitable error due to noise, interference and fading occurs according to channel condition, causing a loss of information. Generally, in order to reduce the loss of information, the system uses various error control techniques according to the characteristics of the channel, thereby increasing the system reliability. The most typical the error control technique uses error correction codes. The LDPC code is one of the error correction codes.

The LDPC code, a code proposed by Gallager, is defined by a sparse binary parity check matrix in which the major elements have a value of '0' and the minor elements except for the elements having a value of '0' have a value of '1'. That is, the elements constituting the binary parity check matrix have only one of '0' and '1'.

Unlike this, a parity check matrix of a non-binary LDPC code is made up of elements in a Galois Field (GF) ($q=2^p$) (where q is an integer greater than 2). Herein, p has an integer value greater than 1, and if p=1, the corresponding code is a binary LDPC code.

It has been experimentally proven that the non-binary LDPC code is superior in performance to the binary LDPC code. In addition, the structured parity check matrix is superior to the unstructured parity check matrix in terms of high decoding speed and low required storage capacity. Therefore, a scheme for generating (designing) the non-binary structured LDPC code is now the subject of extensive research.

SUMMARY OF THE INVENTION

An aspect of the present invention is to address at least the problems and/or disadvantages and to provide at least the advantages described below. Accordingly, an aspect of the present invention is to provide a method for generating a non-binary structured Low Density Parity Check (LDPC) code.

Another aspect of the present invention is to provide a non-binary structured LDPC code generation method for minimizing the required storage capacity.

According to one aspect of the present invention, there is provided a method for generating a non-binary Low Density Parity Check (LDPC) code. The method includes generating non-binary identity matrixes so as to satisfy at least one of predetermined conditions, wherein the non-binary LDPC code is defined by a parity check matrix, and the parity check matrix includes a plurality of sub-matrixes, which are divided into zero matrixes and the non-binary identity matrixes.

BRIEF DESCRIPTION OF THE DRAWINGS

The above and other objects, features and advantages of the present invention will become more apparent from the following detailed description when taken in conjunction with the accompanying drawings in which:

FIG. 1 is a diagram illustrating a $P^i$ matrix in a structured LDPC code;

FIG. 2 is a diagram illustrating non-binary structured LDPC codes of individual types according to an embodiment of the present invention; and FIGS. 3A and 3B are graphs illustrating performances for individual types in terms of variation in $GF(q=2^p)$ according to an embodiment of the present invention.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides a method for generating a non-binary structured Low Density Parity Check (LDPC) code.

Generally, to generate a binary LDPC code that exhibits a high performance, degree distribution should be taken into consideration. The term 'degree' as used herein refers to the number of edges connected to the nodes, i.e. variable nodes and check nodes, in a factor graph of the LDPC code. In addition, the term 'degree distribution in a factor graph of an LDPC code' refers to a ratio of the number of nodes having a particular degree to the total number of nodes. It has already been proved by Richardson et al. that an LDPC code having particular degree distribution is superior in performance. Therefore, the degree distribution should be taken into account even when the non-binary structured LDPC code according to the present invention is designed.

A description will now be made of a method for generating a parity check matrix (H matrix) in a non-binary structured LDPC code proposed in the present invention.

A parity check matrix of a non-binary structured LDPC code is made up of multiple sub-matrixes. The sub-matrixes each are a square matrix with dimension $Z_f$, and can be divided into zero matrixes and shifted identity matrixes $P^i$. The term 'shifted identity matrix' refers to a matrix in which a position of each row is cyclic-shifted by i.

FIG. 1 illustrates a $P^i$ matrix in a structured LDPC code.

Referring to FIG. 1, $P^1$ is a matrix obtained by right cyclic-shifting a position of '1' in each row of an identity matrix by one element. In addition, $P^i$ is a matrix obtained by right cyclic-shifting a position of '1' in each row of an identity matrix by i elements. Herein, when all elements of the matrix $P^i$ have only one of '0' and '1', the corresponding code is a binary LDPC code, and unlike this, when all elements of the matrix $P^i$ have '0' or elements in $GF(q=2^p)$, the corresponding code is a non-binary LDPC code. Therefore, sub-matrixes constituting a parity check matrix of a non-binary structured LDPC code can expressed in zero matrixes and non-binary shifted identity matrixes Q. The Q can be expressed in three types of matrixes. In the present invention, the three types of Q matrixes will be denoted by Type 1, Type 2 and Type 3, respectively. Equation (1) to Equation (3) express Type 1 to Type 3, respectively.

$$Q = \alpha^{F(i)} \cdot P^i, 1 \leq i \leq Z_f \quad (1)$$

$$Q = \alpha^j \cdot P^i, 0 \leq j \leq q-2, 1 \leq i \leq Z_f \quad (2)$$

$$Q = S \cdot P^i, S = \begin{bmatrix} \alpha^{j_1} & 0 & 0 & \cdots & 0 \\ 0 & \alpha^{j_2} & 0 & \cdots & 0 \\ 0 & 0 & \alpha^{j_3} & \cdots & 0 \\ \vdots & \vdots & \vdots & \ddots & 0 \\ 0 & 0 & 0 & \cdots & \alpha^{j_{Z_f}} \end{bmatrix} \quad (3)$$

In Equations (1) to (3), a denotes a primitive element in $GF(q=2^p)$. In addition, '·' in Equations (1) and (2) means a scalar product, and '·' in Equation (3) means a matrix product. Further, in Equation (1), F(i) means a one-to-one mapping function, and can be, for example, F(i)=i. In this case, Equation (1) can be simply expressed as $Q=\alpha^i \cdot P^i$, $1 \leq i \leq Z_f$. In Equation (3), $j_k$ means an arbitrary value among the values k satisfying $1 \leq k \leq Z_f$.

A non-binary structured LDPC code can be generated by generating sub-matrixes using the three types of the Q matrixes, and forming a parity check matrix using the generated sub-matrixes. Herein, the parity check matrix should be formed using only one of the three types of the Q matrixes.

FIG. 2 illustrates non-binary structured LDPC codes of individual types according to an embodiment of the present invention.

In order to apply the non-binary structured LDPC codes of individual types shown in FIG. 2 to the hardware, position information of the Q matrixes and information on the values i and j should be stored. Therefore, the amount of the information stored in the memory can be different according to the types. For example, the required size of the memory increases in order of Type 1, Type 2 and Type 3. Equations (4) to (6) represent required memory sizes (the number of bits) for individual types.

$$N_b \times Avg.Dv \times \lceil \log_2 M_b \rceil, \text{(Type 1)} \quad (4)$$

$$N_b \times Avg.Dv \times \lceil \log_2 M_b \rceil + N_b \times Avg.Dv \times p, \text{(Type 2)} \quad (5)$$

$$N_b \times Avg.Dv \times \lceil \log_2 M_b \rceil + N_b \times Avg.Dv \times Z_f \times p, \text{(Type 3)} \quad (6)$$

In Equations (4) to (6), $N_b$ and $M_b$ mean the number of sub-matrixes in a row and a column of a parity check matrix, respectively, and Avg.Dv means the average number of the Q matrixes existing in each column of the parity check matrix. In addition, p corresponds to a value p in $GF(q=2^p)$.

It can be noted that if only the required memory sizes based on Equations (4) to (6) are taken into consideration, a non-binary structured LDPC code including the Q matrixes of Type 1 is more efficient than a non-binary structured LDPC code including the Q matrixes of Type 2 or Type 3. However, it cannot be asserted that if the performance is also taken into account, the non-binary structured LDPC code including the Q matrixes of Type 1 is more efficient than the non-binary structured LDPC code including the Q matrixes of Type 2 or Type 3.

The factor that should be considered during performance comparison between the Q matrixes of individual types is a relationship between $Z_f$ and an order of GF. Herein, the order of GF denotes q.

FIGS. 3A and 3B illustrate performances for individual types in terms of variations in $GF(q=2^p)$ according to an embodiment of the present invention.

As illustrated, it can be noted that for $Z_f \gg q$ (i.e. for GF(4) and GF(8)), non-binary structured LDPC codes including the Q matrixes of Type 1, Type 2 and Type 3 show similar Frame Error Rate (FER) performances. However, for $Z_f \ll q$ (i.e. for GF(64) and GF(256)), non-binary structured LDPC codes including the Q matrixes of Type 2 and Type 3 are superior in FER performance to a non-binary structured LDPC code including the Q matrixes of Type 1.

As is apparent from the foregoing description, the present invention provides a scheme of generating a parity check matrix in a non-binary structured LDPC code, thereby improving decoding performance.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for using a parity check matrix of a non-binary Low Density Parity Check (LDPC) code during data transmission in a mobile communication system, the method comprising:

generating the parity check matrix of the non-binary LDPC code, wherein the parity check matrix includes a plurality of sub-matrixes, which are divided into zero matrixes and non-binary identity matrixes, the non-binary identity matrixes are generated by using at least one condition among a first condition, a second condition and a third condition; and performing data transmission in the mobile communication system with an error control technique that uses the parity check matrix.

2. The method of claim 1, wherein the at least one condition comprises the first condition to satisfy $$Q=\alpha^{F(i)} \cdot P^i, 1 \leq i \leq Z_f$$

where α denotes a primitive element in a Galois Field (GF), F(i) denotes a one-to-one mapping function, denotes a scalar product, $P^i$ denotes a matrix obtained by cyclic-shifting a position of '1' in each row of an identity matrix by i, and $Z_f$ denotes a square matrix having a specific size.

3. The method of claim 1, wherein the at least one condition comprises the second condition to satisfy $$Q=\alpha^j \cdot P^i, 0 \leq j \leq q-2, 1 \leq i \leq Z_f$$

where α denotes a primitive element in a GF, '·' denotes a scalar product, $P^i$ denotes a matrix obtained by cyclic-shifting a position of '1' in each row of an identity matrix by i, p denotes p in a $GF(q=2^p)$ (where q is an integer greater than 2), and $Z_f$ denotes a square matrix having a specific size.

4. The method of claim 1, wherein the at least one condition comprises the third condition to satisfy $$Q = S \cdot P^i, \quad S = \begin{bmatrix} \alpha^{j_1} & 0 & 0 & \cdots & 0 \\ 0 & \alpha^{j_2} & 0 & \cdots & 0 \\ 0 & 0 & \alpha^{j_3} & \cdots & 0 \\ \vdots & \vdots & \vdots & \ddots & 0 \\ 0 & 0 & 0 & \cdots & \alpha^{j_{z_f}} \end{bmatrix}$$

where $\alpha$ denotes a primitive element in a GF, '·' denotes a matrix product, and $P^i$ denotes a matrix obtained by cyclic-shifting a position of '1' in each row of an identity matrix by i.

\* \* \* \* \*